(12) United States Patent
Yee

(10) Patent No.: US 8,446,979 B1
(45) Date of Patent: May 21, 2013

(54) PREDISTORTION WITH INTEGRAL CREST-FACTOR REDUCTION AND REDUCED OBSERVATION BANDWIDTH

(75) Inventor: Paul Yee, Vancouver (CA)

(73) Assignee: PMC-Sierra, Inc., Sunnyvale, CA (US)

( * ) Notice: Subject to any disclaimer, the term of this patent is extended or adjusted under 35 U.S.C. 154(b) by 585 days.

(21) Appl. No.: 12/715,745

(22) Filed: Mar. 2, 2010

(51) Int. Cl.
  *H04K 1/02* (2006.01)
(52) U.S. Cl.
  USPC ........... 375/296; 375/219; 375/295; 375/297; 455/108; 455/114.2; 455/114.3; 455/126; 455/127.1
(58) Field of Classification Search
  USPC .................. 375/219, 295, 296, 297; 455/108, 455/114.2, 114.3, 126, 127.1
  See application file for complete search history.

(56) References Cited

U.S. PATENT DOCUMENTS

| | | | |
|---|---|---|---|
| 6,356,146 B1 | 3/2002 | Wright et al. | |
| 7,061,990 B2 | 6/2006 | Wright et al. | |
| 7,061,991 B2 | 6/2006 | Wright et al. | |
| 7,099,399 B2 | 8/2006 | McCallister | |
| 7,142,831 B2 | 11/2006 | Anvari | |
| 7,409,011 B2 | 8/2008 | Wright et al. | |
| 7,453,954 B2 | 11/2008 | Wright et al. | |
| 7,983,327 B2 * | 7/2011 | Brobston | 375/219 |
| 8,185,065 B2 * | 5/2012 | McCallister et al. | 455/114.2 |
| 2003/0104792 A1 * | 6/2003 | Doi | 455/115 |
| 2005/0157814 A1 | 7/2005 | Cova et al. | |
| 2006/0229036 A1 | 10/2006 | Muller et al. | |
| 2008/0265996 A1 | 10/2008 | Kim et al. | |

OTHER PUBLICATIONS

Nagata, Y.; Linear Amplification Technique for Digital Mobile Communications; IEEE Vehicular Technology Conference, 39th; pp. 159-164; 1989; San Francisco, California.
Cavers, J.K.; Amplifier Linearization Using A Digital Predistorter With Fast Adaptation and Low Memory Requirements; IEEE Transactions on Vehicular Technology; vol. 39; pp. 374-383; Nov 1990.
Bateman, et al.; Linear Transceiver Architectures; IEEE Proc. Veh. Technology. Conf.; Philadelphia, PA; 1988; IEEE Catalog 2622-9/88/0000-0478; pp. 478-484.
Stewart, et al.; Feedforward Linearization of 950 MHz Amplifiers; Inst. Elec. Eng. Proc.; vol. 1, pt.H, No. 5; pp. 347-350; Oct. 1988.

* cited by examiner

*Primary Examiner* — Leon Flores
(74) *Attorney, Agent, or Firm* — Knobbe Martens Olson & Bear LLP

(57) ABSTRACT

Apparatus and methods configure digital predistortion linearizers for power amplification of bandlimited signals using non-linear amplifiers. The predistorter is configured to achieve both crest factor reduction (CFR) and predistortion for linearization. One embodiment advantageously reduces processing requirements conventionally associated with CFR by considering only the in-band component, that is, the information bearing component, of the desired signal to be reproduced for those cases in which the mitigation of in-band error vector magnitude (EVM) is preferred over the reduction of spurious out-of-band emissions.

26 Claims, 7 Drawing Sheets

PREDISTORTION WITH INTEGRAL CREST-FACTOR REDUCTION AND REDUCED OBSERVATION BANDWIDTH

BACKGROUND

1. Field of the Invention

Embodiments of the invention generally relate to radio frequency (RF) signal amplification, and in particular, embodiments relate to the amplification of multi-carrier signals.

2. Description of the Related Art

Radio frequency power amplifiers are widely used to transmit signals in communications systems. Typically, a signal to be transmitted is concentrated around a particular carrier frequency occupying a defined channel. Information can be sent as a modulation of amplitude, phase, frequency, or combination of these that causes the information to be represented by energy spread over a band of frequencies around the carrier frequency. In many schemes, the carrier itself is not sent since the carrier is not essential to the communication of the information.

When a signal containing amplitude variations is amplified by a power amplifier, the amplified signal is distorted if the power amplifier does not exhibit a linear amplitude and phase transfer characteristic. When distortion is present, the output of the amplifier is not linearly proportional to the input. Distortion also occurs if (a) the phase shift introduced by the power amplifier is not linear over the range of frequencies present in the signal; or (b) the phase shift caused by the power amplifier varies with the amplitude of the input signal or vice versa (AM to PM or PM to AM, respectively).

The introduced distortion can include intermodulation of the input signal's components. The products of the intermodulation can appear within the bandwidth of the input signal causing undesirable interference. The intermodulation products can also extend outside the bandwidth originally occupied by the signal. Such out-of-band products can cause interference in adjacent channels and violate transmitter licensing and regulatory spectral emission requirements. Although filtering can be used to remove the unwanted out-of-band distortion, filtering is not always practical, especially if the amplifier is required to operate with multiple frequencies.

Distortion products that are at multiples of the carrier frequency (harmonic distortion) can also be produced in a non-linear amplifier. Harmonic distortion is relatively simple to remove by filtering.

Intermodulation can also be a problem when multiple signals are amplified in the same amplifier even if they individually do not have amplitude variations. A combination of multiple signals can produce amplitude variations as the various components beat with each other by adding and subtracting as their phase relationships change.

Power amplifiers can introduce some distortion even when well designed. Perfect linearity over a wide range of amplitude is impractical to realize in practice. In addition, as any power amplifier nears its maximum output power capacity, the output no longer increases as the input increases. At that point, the power amplifier is not regarded as linear. A typical power amplifier becomes significantly non-linear at a small fraction of its maximum output capacity. In order to maintain linearity, a power amplifier can be operated at an input and output amplitude that is low enough for the signals to be amplified in a part of the transfer characteristic which is substantially linear. However, with that type of operation, known as "backed off," the power amplifier has a relatively low supplied power to transmitted power conversion efficiency. For example, a "Class A" amplifier may be linear enough to transmit a signal cleanly, but may be only 1% efficient. Low efficiency is wasteful of power and increases the size and cost of the power amplifier. Further, the power that is wasted is dissipated as heat, which has to be removed by cooling.

Communication schemes can include modulating constant-amplitude signals with frequency and phase modulation. These signals are relatively unaffected by distortion and can be amplified with highly non-linear amplifiers, which are smaller, cooler, more power efficient, and less expensive. Modulation of that type is used in, for example, conventional radio paging systems that use continuous phase frequency shift keying (CPFSK) modulation.

Bandwidth efficient modulation schemes typically use both amplitude and phase variation. In addition, users may transmit multiple signals on different channels, for example, different carrier frequencies, with a single power amplifier. That reduces the number of separate amplifiers used and avoids the need for large and costly high level output signal combining filters, which can have undesirable power losses.

Digital Predistortion

North American digital cellular telephony services employ linear modulation schemes to encode baseband information in both the amplitude and phase of an RF carrier for efficient bandwidth utilization. If significant intermodulation and distortion products are to be avoided, "class A" linear amplifiers can be employed. However, as described earlier, high-power linear amplifiers are generally inefficient and undesirable in systems in which cost and heat dissipation are prohibitive factors, for example, cellular telephone basestations, wireless access points, and the like.

To avoid the compromise of constraints between the regulatory spectral emission mask and amplifier efficiency, attempts have been made to harness the efficiency of nonlinear class AB power amplifiers by various linearization techniques. Analog feedback techniques have been reported, but these approaches can be limited to relatively narrow operating bandwidths, can be extremely sensitive to amplifier variations, and can be prone to instability. Consequently, these designs may not be appropriate for mass production. See, for example, NAGATA, Y., *Linear Amplification Technique for Digital Mobile Communications*, IEEE Vehicular Technology Conference (1989), pgs. 159-164; and CAVERS, J. K., *Amplifier Linearization Using A Digital Predistorter With Fast Adaptation And Low Memory Requirements*, IEEE Transactions on Vehicular Technology, Vol. 39, No. 4, pp. 374-383, November 1990.

Simulation work has postulated the advantage of adaptive digital feedback at baseband. Such simulation work indicates a relatively good reduction in out-of-band spectral emissions, typically in excess of 25 decibels (dB). These techniques are relatively insensitive to amplifier variations and provide an attractive design suitable for mass production. An adaptive complex gain predistorter achieves a reduction in out-of-band spectra in excess of 20 dB for a class AB amplifier operating close to saturation. See, for example, A. BATEMAN, D. M. HAINES, AND R. J. WILKINSON, *Linear Transceiver Architectures*, IEEE Proc. Veh. Technology Conf., Philadelphia, Pa. (1988), IEEE Catalog 2622-9/88/0000-0478, pp. 478-484; and R. D. Stewart and F. F. Tusubira, *Feedforward Linearization of 950 MHz amplifiers*, Inst. Elec. Eng. (IEE) Microwaves, Antennas and Propagation, Proceedings H, Vol. 135, No. 5, pp. 347-350, October 1988.

Complex Gain Predistortion

FIG. 1 illustrates a software/hardware configuration for an adaptive linearization circuit. In addition to the typical forward path components (digital-to-analog converter 102, quadrature upconverter 104, local oscillator 118) of a power amplifier 106, a feedback loop with an RF coupler 108, a quadrature downconverter 110, and an analog-to-digital converter 112 are present.

Signal designations refer to the complex baseband signals or the complex envelope of the bandpass signals. The illustrated notation is compatible with the original theoretical work of Cavers. A complex gain predistorter 114 generates a baseband complex modulation envelope Vd(t) that complements the nonlinearities introduced by the power amplifier 106. An adaptive estimator 116 compares a desired reference signal Vm(t) with an observed signal Vf(t) originating from the power amplifier 106, and estimates the complex gain predistortion coefficients. The measured complex modulation envelope Vf(t) is a scaled, rotated, and delayed version of the power amplifier output Va(t). The characteristics of the complex gain predistorter 114 are selected such that its nonlinearity is complementary to that of the power amplifier 106. Further details of predistortion linearization based on FIG. 1 can be found in U.S. Pat. No. 6,356,146 to Wright, et al., the disclosure of which is hereby incorporated by reference in its entirety herein.

The adaptive algorithms employed in predistortion linearizers are typically intended to tune their parameters to minimize the total error (typically mean-squared error) between the desired reference signal Vm(t) and the observed signal Vf(t). However, the degree of linearization actually achieved can vary significantly according to both the instantaneous characteristics of the desired reference signal Vm(t) being predistorted and the amplifier's transfer characteristic. For example, those portions of the desired reference signal Vm(t) that exercise the saturated portion of the amplifier transfer characteristic (where its slope is approaching zero), cannot be effectively linearized due to the very large instantaneous corrective gain that would be applied by the predistorter 114. On the other hand, amplifier operation in the saturated region can be desirable for maximum efficiency with state-of-the-art amplifier designs. Assuming that the amplifier transfer characteristic is smooth and exhibits no other noninvertible regions prior to entering saturation, the overall linearity achievable with that amplifier is primarily defined by the rate and degree to which the desired reference signal Vm(t) exercises the saturation region of the amplifier's transfer characteristic. Recognition of the foregoing observation has led to two main approaches.

In one approach, the amplifier input signal is scaled downwards so that its peak power is statistically limited to some probability and level below saturation that is deemed acceptable, for example, from a spectral regrowth point of view, prior to predistortion. The output power backoff (OPBO) technique is effective in reducing the amount of nonlinearity, but typically incurs a relatively large loss of amplifier efficiency due to amplifier operation below saturation. Applying predistortion in that scenario can extend an amplifier's input range for a given level of acceptable distortion, but does not otherwise fundamentally improve upon the limitation posed by the maximum saturated output power of the amplifier.

In a second approach, the amplifier input signal is modified so that its crest factor, that is, its peak-to-average ratio (PAR) in amplitude or power, is decreased prior to predistortion. With crest factor modification, the relative frequency and amplitude of signal peaks are reduced so that the amplifier input signal can be scaled upwards to operate the amplifier closer to saturation for improved efficiency. Often, this crest factor reduction (CFR) is achieved at the expense of impairing in-band error vector magnitude (EVM), which can limit its application when EVM is subject to regulation. One disadvantage of conventional CFR is the additional power and complexity of the CFR hardware, along with the processing latency incurred (for time-critical systems).

U.S. Pat. No. 7,142,831 to Anvari is representative of a conventional approach in which the CFR circuit follows a predistorter. The two modules are controlled, operated, and have their respective parameters chosen separately rather than jointly. As such, overall system complexity and performance may often be suboptimal and can be improved.

U.S. Pat. No. 7,099,399 to McCallister describes a predistorter that provides a feedback signal that indicates the quality of overall system output so that a CFR circuit can modify its behavior to improve or meet its performance target (such as residual error). The CFR is a separate entity from the predistorter and their interaction is limited to a single feedback signal between the two entities, which requires that their respective adjustments be made sequentially rather than simultaneously, that is, jointly. Such sequential or "ping-pong" adjustments are generally suboptimal in final performance as well as convergence speed.

U.S. Patent Application Publication No. 2006/0229036 by Muller, et al., describes a predistorter responsive to, among other characteristics, a crest factor as an input. Muller's approach can be viewed as a feedforward counterpart to the feedback approach of U.S. Pat. No. 7,099,399 to McCallister and should be subject to the same limitations of complexity, final performance and convergence speed.

U.S. Patent Application Publication No. 2005/0157814 by Cova, et al. describes a crest factor of the predistorter input signal being used to select the signals to which the predistorter is adapted. By ensuring that such high crest factor portions of the predistorter input signal are adequately reflected in the choice of predistortion parameters, overall system performance can be improved relative to a predistorter that is adapted randomly over its input signal. Complexity, however, remains similar to that of a cascade of a CFR followed by a predistorter as two separate entities.

SUMMARY OF THE DISCLOSURE

The invention includes crest factor reduction (CFR) with relatively low-complexity and with a reduced observation bandwidth. The previously separate operations of predistortion and CFR can be advantageously combined into a single operation. The methods disclosed also decrease processing requirements by only considering the in-band, that is, information bearing, component of the desired signal in those cases in which mitigating in-band EVM rather than spurious out-of-band emissions is preferred, such as in some WiMAX radio systems.

The reduction of EVM can be beneficial to the operation of radio systems that are subject to regulatory requirements regarding transmission EVM as well as out-of-band/adjacent channel spectral emissions. Embodiments of the invention may be employed with any type of digital predistortion that uses the following operation. A signal that is to be amplified is predistorted in a manner complementary to the distortion of the non-linear amplifier. The complementary predistortion is such that when it is followed by the non-linear amplifier's distortion, the two distortions cancel to provide a relatively linearly amplified replica of the input signal.

Disclosed techniques improve the performance of predistortion linearization in digital radio transmission systems (such as wireless local area networks (WLANs) and cellular systems) that employ adaptive predistortion. Embodiments of the invention automatically adjust the control signals and information that direct the adaptation of a predistortion linearizer's parameters so that the predistorter performs CFR concurrently with predistortion. Disclosed techniques can realize the combined CFR/predistortion with reduced operating complexity by correcting only in-band distortion, which can be an important consideration in certain circumstances, such as, for example, WiMAX systems, in which in-band EVM is the dominant impairment from non-linear amplifiers.

The disclosed techniques are practical to implement of digital linearization and predistortion of radio transmission equipment such as cellular, WLAN, and personal communication service (PCS) basestation amplifiers.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Although particular embodiments are described herein, other embodiments of the invention, including embodiments that do not provide all of the benefits and features set forth herein, will be apparent to those of ordinary skill in the art.

Figure 1:
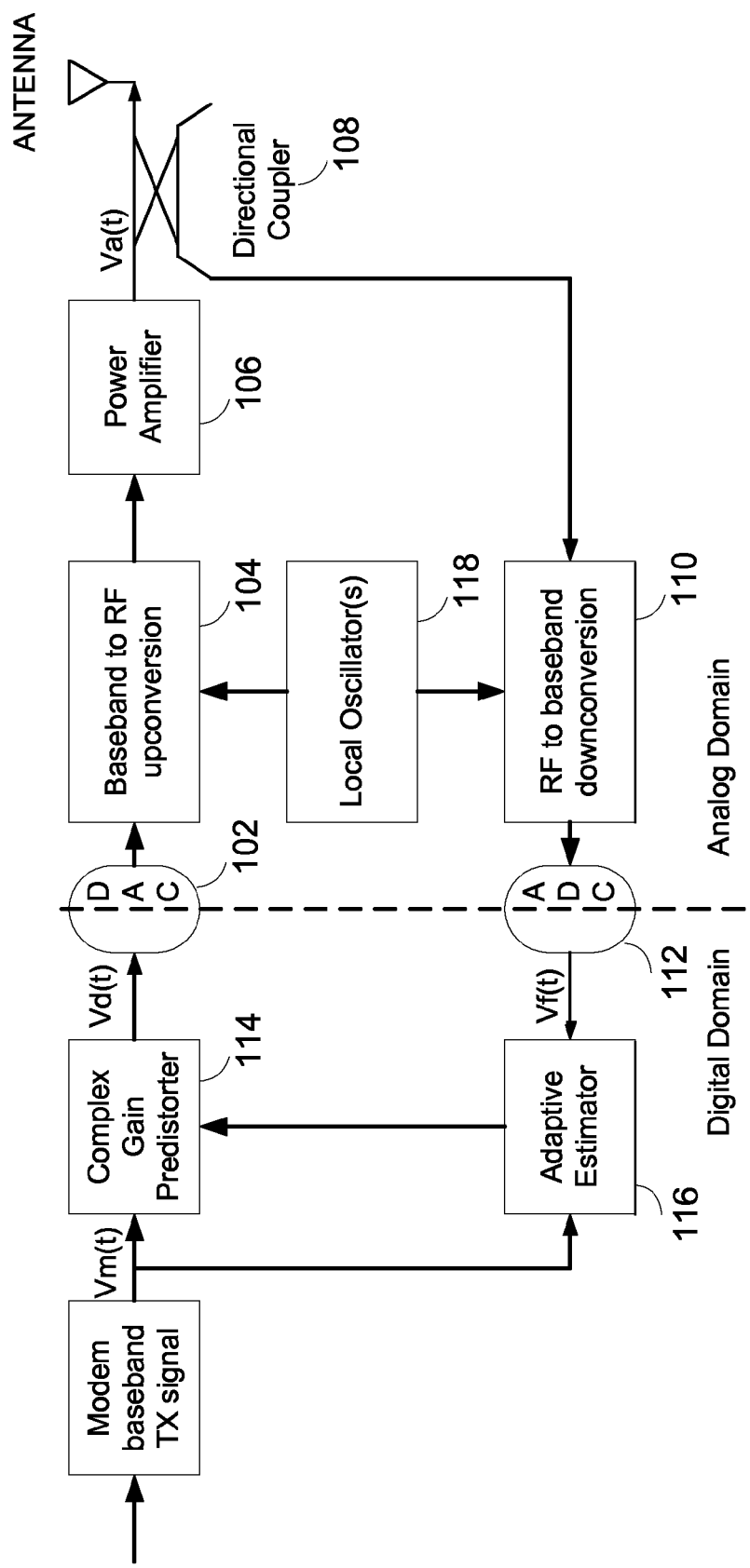
FIG. 1 illustrates a conventional adaptive linearization circuit utilizing predistortion.
Figure 2:
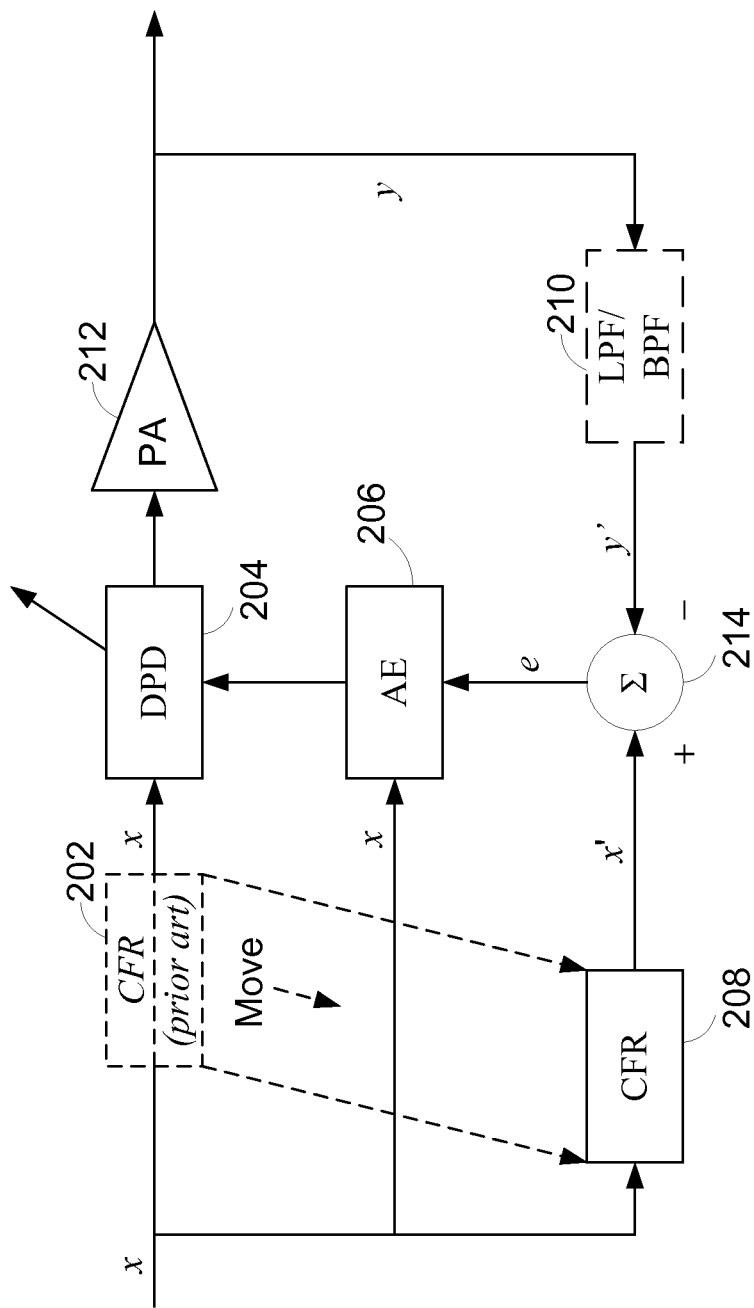
FIG. 2 illustrates a comparison between an embodiment of the invention and a conventional crest factor reduction (CFR) technique.

FIG. 2 contrasts an embodiment of the invention with a conventional crest factor reduction (CFR) technique. The block diagrams of FIGS. 2, 3, 5, and 6 are modeled at complex baseband so that blocks for quadrature modulation (when applicable), digital-to-analog conversion, upconversion, RF coupling, and downconversion, filtering for downconversion and anti-aliasing, analog-to-digital conversion, and quadrature demodulation are not shown. In conventional DPD systems with CFR, the CFR function is present in the signal path ahead of the predistorter (DPD) 204, as shown by the dashed box 202 of FIG. 2 or is present in both the forward signal path to the DPD 204 and in the forward signal path for the adaptive estimator AE 206. By contrast, in embodiments of the invention, the CFR function 208 is advantageously not present in the signal path for the DPD 204.

In embodiments of the invention, rather than having the CFR function in a forward path preceding the predistorter (DPD) 204, the CFR 208 is disposed only in the parameter adaptation path for the predistorter DPD 204. Specifically, CFR is applied to the reference signal x prior to the generation of the adaptation error signal e, which is a controlling element of the predistorter parameter adaptation AE 206. By applying the explicit CFR function only in the adaptation path, the predistorter DPD 204 is directed through adaptation to incorporate elements of CFR into its predistortion function, that is, the predistorter DPD 204 will operate to perform elements of CFR. This occurs without the additional processing or power load of an explicit CFR operating at the full data rate.

The combined CFR and predistorter behavior is realized with relatively little to no additional operating complexity and can permit the use of a reduced bandwidth observation signal (optional "LPF/BPF" block 210 applied to the observation signal y) in the computation of the adaptation error signal e. While, as in the conventional art, a CFR function applied to a forward path of a DPD 204 necessarily runs at the full bandwidth of the reference signal x, the adaptation path typically operates at a much reduced bandwidth. While the DPD 204 operates at full data rate, the adaptation process for the DPD 204 is typically not performed in real time and is typically not performed continuously. For example, periodically or on some other basis, the AE 206 uses samples of the adaptation error signal e. For example, these samples can correspond to the samples of a relatively small window in time, and thus, it is advantageously computationally and power efficient for the CFR 208 to not operate at the full data rate, but at a reduced data rate, and preferably, only for the samples that would be used for generation of the adaptation error signal e. This saves both electrical power, which can be an important consideration in a relatively low power system such as battery-powered equipment, and processing power, which can ease the burden on an associated microprocessor, microcontroller, DSP, or the like. In addition, while not illustrated in the complex baseband model, digital-to-analog conversion and upconversion can be disposed in a signal path between the DPD 204 and the PA 212. An RF coupler can be used at the output of the PA 212 to generate the observed signal y. The observed signal y can then be downconverted, filtered for downconversion and anti-aliasing, then converted to digital for possible further processing by the filter 210 or a preprocessor to be described later in connection with FIG. 6.

The circuit illustrated in FIG. 2 can be implemented in many different ways, such as, but not limited to, digital signal processing hardware circuits, software executed by computer hardware, or by a combination of the two. Although the embodiment illustrated in FIG. 2 does not use feedback or have other interaction between the DPD 204 and the CFR 208, such feedback or other interaction can be present in alternative embodiments.

In the embodiment illustrated in FIG. 2, the adaptive estimator AE 206 performs the core processing of adjusting the parameters of the predistorter DPD 204 to achieve the desired performance objective. For example, in a conventional predistortion system, a typical target is to minimize the difference or error between the observed signal y and the reference input signal x that is to be amplified by a power amplifier PA 212. With an explicit CFR block or processor 208 present only in the adaptation path, the output signal of the CFR 208 corresponds to a modified input reference signal x' in FIG. 2.

The adaptation error signal e is generated as a difference 214 (implementable by a differencing circuit) between the modified input reference signal x' and the filtered observed signal y' generated at the output of the amplifier according to Equation 1. As will be discussed later in connection with a least mean square (LMS) algorithm and Equation 5, one embodiment of the AE 206 also uses samples of the input reference signal x as an input for adaptation. The circuit computing the difference 214 can be implemented in software/firmware by instructions executed by a microprocessor, controller, or the like, based on data samples stored from the CFR 208 and the optional LPF/BPF 210. Of course, the difference 214 should be computed based on corresponding data samples, which may have to be adjusted for differences in time delays between the forward path including the CFR 208 and the feedback path including the optional LPF/BPF 210.

$$e = x' - u' \qquad \text{Equation 1}$$

A feature of the invention is that the reference or target signal x' used for adaptation (to form the error signal e) of the DPD 204 and the input signal x, which is predistorted by the DPD 204, are not identical. The reference signal used for adaptation is the modified input signal x', that is, the reference signal x with CFR applied, while the input signal x is used as an input to the predistorter DPD 204. By doing so, the predistorter DPD 204 realizes joint predistortion and CFR operation, simultaneously, in a single combined entity. In addition, since the adaptation path with the modified input signal x' does not have to operate at full bandwidth, a power savings for CFR can be realized.

In applications in which signals having a relatively high peak-to-average ratio (PAR) signals are used, such as those encountered with orthogonal frequency division multiplexing (OFDM), and relatively low in-band error vector magnitude (EVM) is specified instead of reduced out-of-band distortion, another advantage of an embodiment of the invention is that it can operate with a filtered version y' of the observed signal y for the generation of the adaptation error signal e. For example, these types of signals can be encountered in WiMAX (IEEE 802.16) applications.

The optional filter 210, which is typically a low-pass or a band-pass filter, should pass only that portion of the power amplifier output spectrum that corresponds to the reference input spectrum so that the predistortion parameters can be selected to reduce an in-band error vector magnitude (EVM). Relative amounts of out-of-band distortion versus in-band EVM performance can be controlled by adaptively adjusting the filter bandwidth and the attenuation characteristics of the optional filter 210. In one embodiment, the adaptive estimator 206 controls the filter bandwidth and the attenuation characteristics.

For example, when it is desired that in-band EVM performance is to be favored over out-of-band distortion, the characteristics of the optional filter 210 should be selected to favor in-band EVM performance over out-of-band distortion. In response to adaptation of the DPD 204 with the optional filter 210 configured in the foregoing matter, the coefficients of the DPD 204 will be adapted to provide a soft-clip type of CFR characteristic versus a hard-clip type CFR characteristic. Advantageously, the soft-clip type of CFR characteristic results in a relatively lower in-band EVM and out-of-band spectral regrowth.

The same parts or signals appearing in FIGS. 2-7 are designated by the same reference number or letter.

Figure 3:
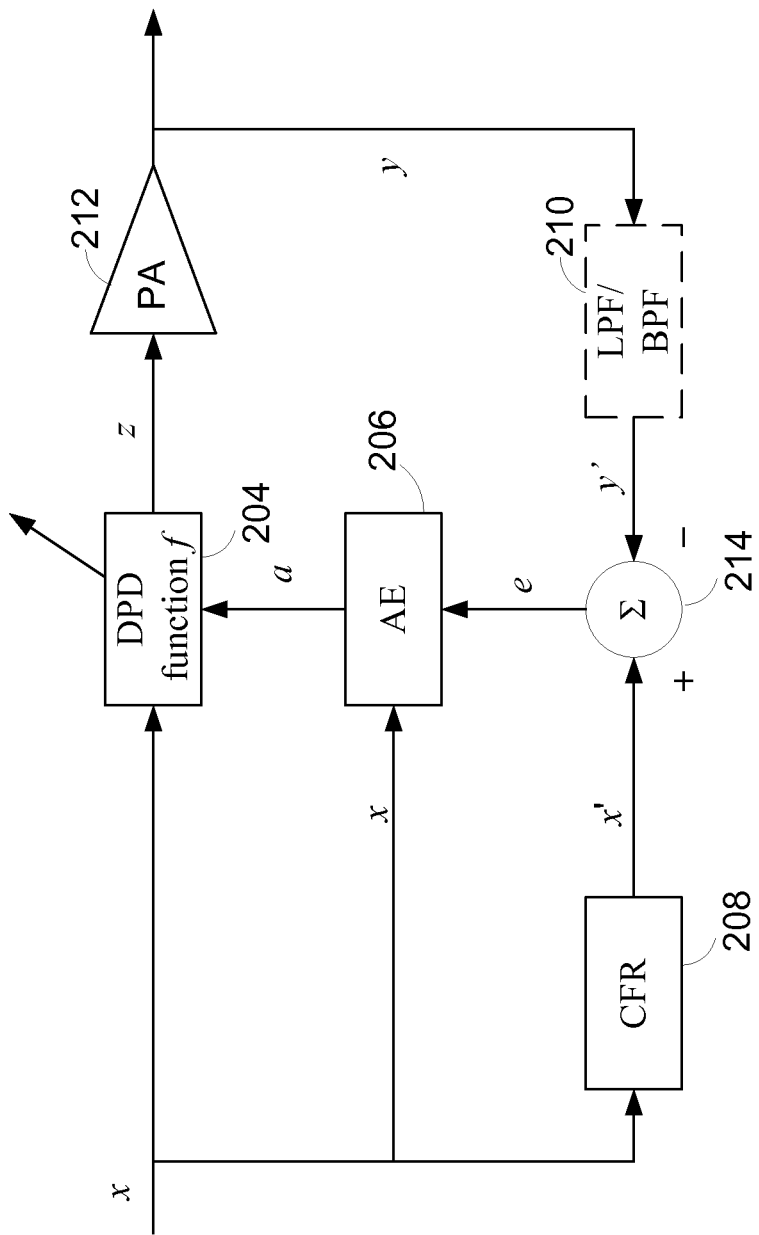
FIG. 3 illustrates an embodiment of the invention.

FIG. 3 illustrates an embodiment of the invention. In the illustrated embodiment, predistortion is performed by the digital predistorter DPD 204, which has an output response f. Output response f includes, but is not limited to, past and future magnitudes of reference input signal x as illustrated in Equation 2.

$$z(n) = f(\{|x(k)|\}_{k=n-L}^{n+M}, a, \ldots) \qquad \text{Equation 2}$$

In Equation 2, parameter a represents a set of DPD parameters, and the limits of time dependence L and M reflect the degree of memory compensation desired, for example, in a memoryless case, L=M=0. Sequence z(n) corresponds to the DPD output signal, which is a modified version of the input signal x(n) for predistortion and crest factor reduction. The sequence z(n) can then be split into separate in-phase (I) and quadrature-phase (Q) components, converted from digital to analog baseband, upconverted to RF, and provided as an input to the power amplifier PA 212. Although not specifically noted in detail here, those versed in the art will understand that the predistortion function f can also include gain, phase, and delay adjustments used to account for distortions or other undesired characteristics of the observation signal path.

In addition to providing predistortion as illustrated in Equation 2, crest factor reduction (CFR) can be provided via a "soft-compression" type of nonlinearity as illustrated in Equation 3.

$$x'(n) = g(\{|x(k)|\}_{k=n-N}^{n+P}, b, \ldots) \cdot x(n) \qquad \text{Equation 3}$$

In Equation 3, variables, parameters, or limits g, N, P, and b have parallel roles to that off, L, M, and a, respectively, described earlier in connection with Equation 2. With reference to Equation 2 and Equation 3, it can be observed that with an appropriate digital predistortion (DPD) function f and parameter a, a single predistorter 204 can provide both predistortion and CFR. In the prior art, a single DPD entity would only be trained for predistortion linearization. In an illustrative example, a memoryless single-dimensional 128 element lookup table (LUT) predistorter DPD will be described in connection with FIG. 4.

Figure 4:
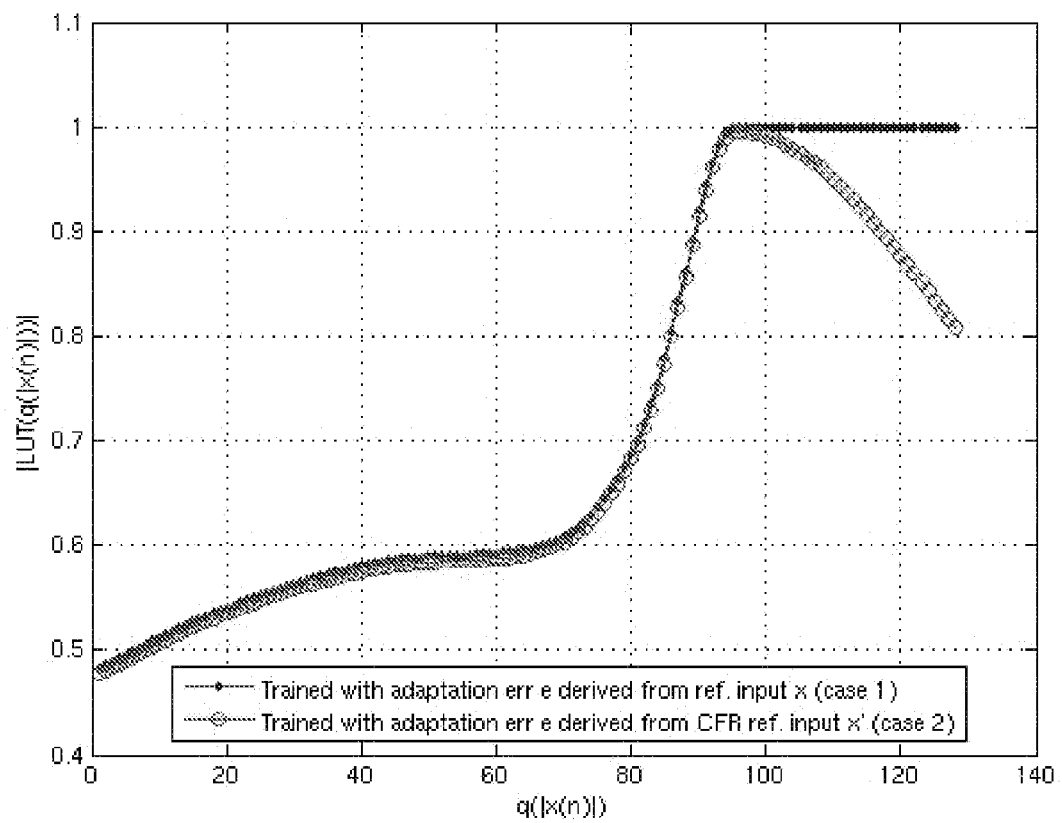
FIG. 4 illustrates a comparison of a memoryless 1-D lookup table (LUT) digital predistortion (DPD) coefficient magnitude for predistortion only versus predistortion with integral CFR.

FIG. 4 illustrates two cases of lookup table (LUT) coefficient magnitudes for a digital predistorter (DPD). A first case corresponds to predistortion only. A second case corresponds to predistortion with integral CFR. A magnitude for input x runs along the horizontal axis. A magnitude of the lookup table (LUT) coefficients runs along the vertical axis.

The output of the DPD 204 is as expressed in Equation 4.

$$z(n) = \text{LUT}(q(|x(n)|)) \cdot x(n), q:[0,1] \subset \mathfrak{R}$$
$$\mapsto \{0,1,\ldots,B-1\} \subset \mathbb{N} \qquad \text{Equation 4}$$

In Equation 4, q(●) corresponds to the quantizer function, which maps the reference input magnitude (assumed to lie in the unit interval without loss of generality) into one of B=128 available complex DPD coefficients $\{a_i\} \in C$, i=0, 1, ..., B−1, selected by the lookup table function LUT(●). The quantizer function provides a piecewise-linear approximation of a continuous-valued complex gain predistorter, and its usage here is merely illustrative and not intended to be limiting. Other functions can be used and will be readily determined by one of ordinary skill in the art. For example, in an alternative embodiment, LUT(●) can be a continuous-valued function of its inputs.

As illustrated in FIG. 4, the LUT coefficients resulting from adaptation with the error signal computed from the reference input signal x (case 1) allow its peaks to pass through, that is, unity gain is applied to reference input signal peaks. By contrast, the LUT coefficients resulting from adaptation with the error signal computed from the CFR reference input signal x' (case 2) exhibit a trend of decreasing predistortion gain as the reference input signal magnitude increases, that is, as LUT coefficients for higher magnitude signals are exercised, the DPD output z in case 2 has peaks considerably lower than provided in case 1. For many challenging operating scenarios such as in WiMAX, in which the signal peaks defining the peak-to-average ratio (PAR) of 10 dB or more occurs at a cumulative probability of 0.01% or less, this reduction of the signal peaks does not significantly alter the average power of the DPD output z. Hence, its overall crest-factor has been reduced. For example, in FIG. 4, the DPD LUT coefficient for the largest input signal amplitude for case 2 is 0.8 versus 1 for case 1, so the crest factor of the DPD output z for case 2 may be expected to be reduced by 1.9 decibels (dB) compared to that of case 1. The foregoing example illustrates how an embodiment of the invention can advantageously be used to simultaneously predistort and reduce the crest-factor of its reference input signal.

Returning back to FIG. 3, the operation of the illustrated embodiment of the invention will be described as follows. During digital predistortion adaptation at a time step n, the adaptation error signal e is computed as the difference between the CFR reference input x' and the filtered observed output y'. Note that when the optional LPF/BPF filter 210 is not used or is set to pass-through operation, the filtered observed output y' will be the same as the unfiltered observed output y in the error calculation. The adaptation error signal e can be computed from stored samples by firmware, such as by execution by a processor of computer instructions stored in a tangible medium. The adaptive estimator AE 206 then computes updated DPD parameters based on the adaptation error signal e and the reference input signal x. For example, in the illustrated embodiment, in which digital predistortion is realized using a 1-D LUT of complex coefficients as described earlier in connection with such Equation 4, a least mean square (LMS) algorithm can be used to compute an updated LUT entry as expressed in the Equation 5.

$$a(i) \rightarrow a(i) + \mu_i \cdot u(\{x(n), e(n) | q(|x(n)|=i\}), i=0,1,\ldots,B-1 \quad \text{Equation 5}$$

In Equation 5, $\mu_i$ are typically adaptation step sizes, and u represents the update function based on the sets of adaptation reference inputs $\{x(n)\}$ and corresponding adaptation errors $\{e(n)\}$, which pertain to the $i^{th}$ DPD coefficient $a_i$ at time step n. Other algorithms can also be used. For example, the update function u can be, but not limited to, an LMS update function as expressed in Equation 6.

$$u(\{x(n), e(n)\}) = \begin{cases} \text{mean}(\{x(n) \cdot e(n)\}) \\ \text{max}(\{x(n) \cdot e(n)\}) \text{(in magnitude)} \\ \text{mean}(\{x(n) \cdot \text{sgn}(e(n))\}) \\ \text{mean}(\{\text{sgn}(x(n)) \cdot \text{sgn}(e(n))\}) \end{cases} \quad \text{Equation 6}$$

Algorithms other than the LMS algorithm can alternatively be used. For example, the recursive least-squares (RLS), Kalman filter and its extended and other variants, gradient search, and nonlinear stochastic approximation algorithms, such as the Robbins-Munro and Kiefer-Wolfowitz iterative methods can be used to generate the DPD coefficient. Other algorithms will be readily determined by one of ordinary skill in the art.

The observed signal y can optionally be filtered 210 to occupy the same bandwidth as the reference input signal x prior to the computation of the adaptation error signal e. The optional filtering 210 provides that the combined DPD-CFR entity resulting from the adaptive estimator AE 206 operation should be well configured to reduce maximally the in-band EVM of the power amplifier PA 212 output arising from residual distortion, which can be an important objective for EVM-constrained applications. By reducing or minimizing the analog bandwidth and digital sampling requirements of the observation signal processing path, the optional filtering 210 results in lower complexity and lower power as compared to the prior art.

In the embodiments illustrated earlier in connection with FIGS. 2 and 3, the adaptive estimator AE 206 is responsible for adapting the combined DPD and CFR parameters for the digital predistorter DPD 204. The adaptive estimator AE 206 is responsive to the reference input signal x and to an adaptation error signal e corresponding to a difference between the modified reference signal x' and the filtered observed signal y'. In an alternative embodiment (not shown), the adaptive estimator AE 206 is responsive to the modified reference input signal x' and to the adaptation error signal e. In certain applications, it can be desirable to adapt the digital predistorter DPD 204 based on more general criteria than the aforementioned reference input signal x and the adaptation error signal e as will be discussed later in connection with FIGS. 5 and 6.

Figure 5:
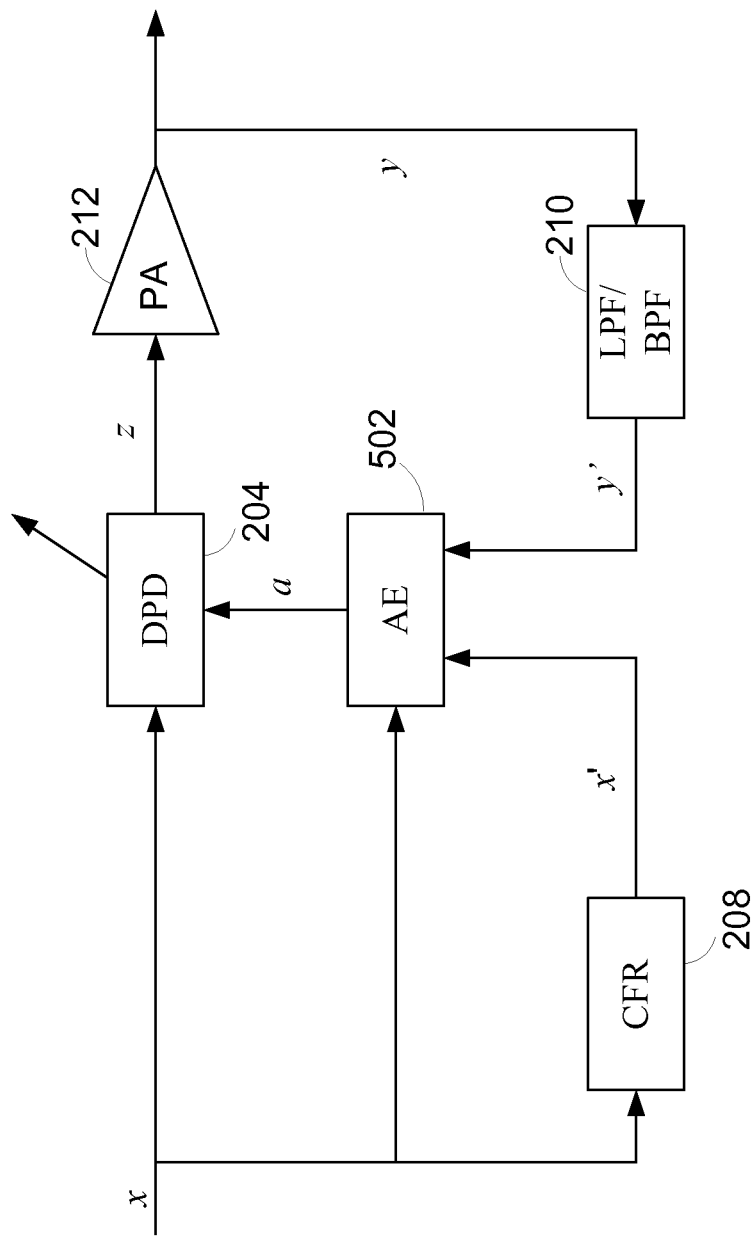
FIG. 5 illustrates an embodiment of the invention with a general adaptation entity.

FIG. 5 illustrates an embodiment of the invention with a general adaptation entity. As illustrated in FIG. 5, the adaptive estimator AE 502 is responsive to samples of the reference input signal x, modified reference signal x' and to the filtered observed signal y'. As illustrative and nonlimiting examples, a nonlinear-, time-, and/or frequency-selective function of the EVM between the modified reference signal x' and the filtered observed signal y' can alternatively be used to direct the adaptation of the digital predistorter DPD 204, yielding corresponding nonlinear-, time-, and/or frequency-selective digital predistorter DPD 204 performance. For example, in a time division duplexing (TDD) system, the adaptive estimator AE 502 can be configured to utilize time intervals of breaks or power control in the reference input signal x to invoke specific techniques and methods suitable for those scenarios. For example, the adaptive estimator AE 502 can be configured to select a particular set of parameters for the digital predistorter DPD 204 from a plurality of sets of digital predistorter DPD parameters, wherein the particular selected set had already been adapted for that scenario (of breaks or power control). In addition, corresponding samples of each of the modified reference signal x' and the filtered observed signal y' are evaluated by the adaptive estimator 502 and the samples from the CFR 208 are not necessarily processed in real time. In an alternative embodiment (not illustrated), rather than utilize the reference signal x as a reference, such as for an index, for the adaptive estimator 502, the adaptive estimator 502 uses the modified reference signal x' as a reference.

In the embodiments described earlier in connection with FIGS. 2-5, the observed signal y can optionally be low-pass or band-pass filtered prior to the generation of adaptation error. While filtering has advantages, other types of processing can alternatively be used as illustrated in FIG. 6.

Figure 6:
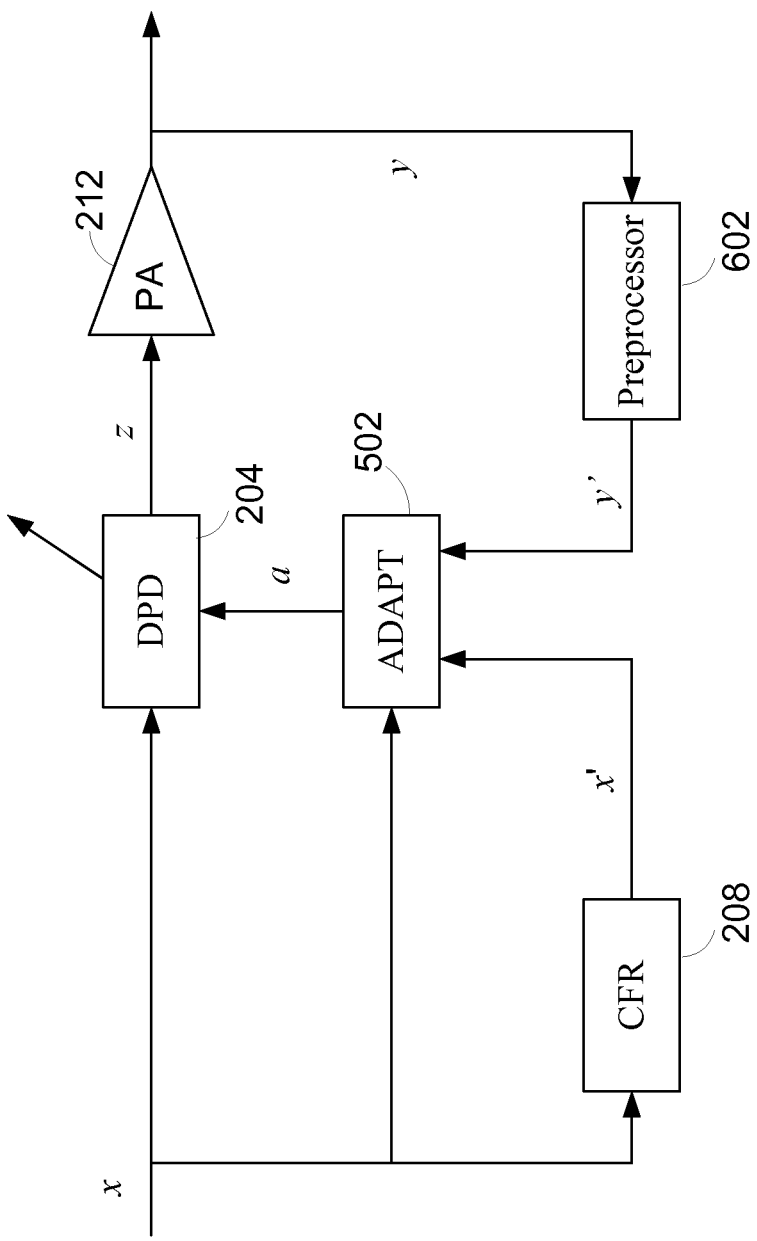
FIG. 6 illustrates an embodiment of the invention with general observed preprocessing.

FIG. 6 illustrates an embodiment of the invention with general observed preprocessing. For example, the preprocessor 602 can be configured to select those portions of the observed signal y that are considered to be important to predistort or otherwise correct by criteria other than or in addition to frequency occupancy. For example, the preprocessed observed signal y' can be hard and/or soft selected or otherwise generated from the observed signal y according to instantaneous, differential, and/or long-term (integrated) amplitude, power, and/or other linear and nonlinear signal characteristics to tailor the digital predistorter 204, which handles both predistortion and crest factor reduction correction, to a particular scenario. Hard selection refers to discretely selecting a subset from the original set, while soft selection refers to the inclusion of a weighting function, possibly to all the samples collected, and then a selection among the weighted samples. For example, the preprocessor 602 can be a memory or memory space configured to collect only those samples corresponding to the beginning and/or the end segments of a time-division duplexing (TDD) transmission to develop DPD and CFR correction parameters for those portions of TDD operation when those portions are determined to be a source of distortion. The corresponding samples of the modified reference signal x' and the preprocessed observed signal y' should be time-aligned. These examples are merely intended to illustrate the general principles underlying the embodiment and are not intended to the invention. In an alternative embodiment (not illustrated), rather than utilize the reference signal x as a reference, such as for an index, for the adaptive estimator 502, the adaptive estimator 502 uses the modified reference signal x' as a reference.

Figure 7:
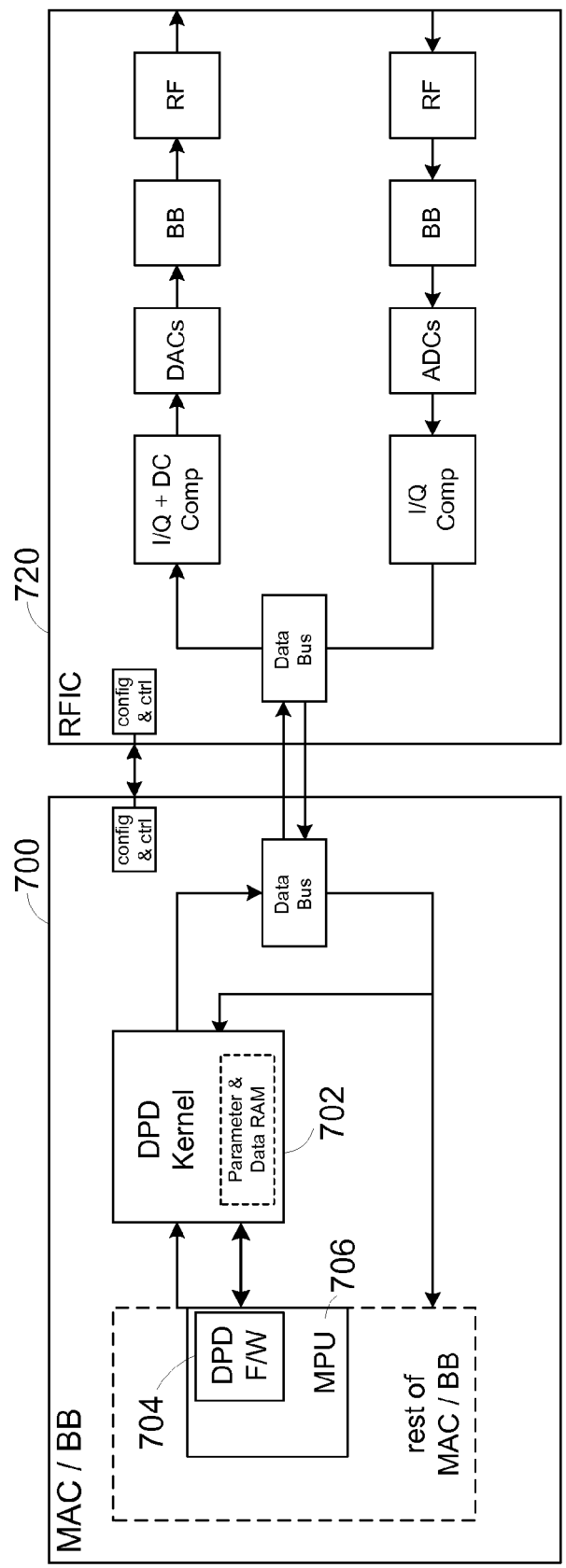
FIG. 7 illustrates predistortion with integral CFR and a reduced observation bandwidth.

FIG. 7 illustrates an embodiment according to the invention of the predistortion with integral CFR and reduced observation bandwidth. To the left of FIG. 7 is a MAC/BB 700 for multiple access control/baseband circuits. To the right of FIG. 7 are the transmit and receive paths for a radio frequency integrated circuit (RFIC) 720.

Due to the relatively fast signal processing requirements of real-time predistortion, predistortion processing is typically implemented by dedicated hardware such as a field programmable gate array (FPGA) or by dedicated hardware in an application specific integrated circuit (ASIC). In FIG. 7, the predistortion processing is handled by the DPD Kernel 702 of the MAC/BB 700.

The DPD Kernel 702 should also have relatively fast access to the compensation parameters, which are preferably stored in random access memory (RAM). In one embodiment, this RAM structure should be accessible by a controlling entity, illustrated in FIG. 7 as the DPD Firmware (F/W) 704 executed by a host microprocessor unit (MPU) 706, such that the controlling entity can provide updated/adapted parameters on a regular basis. For this case, the RAM can also used to store the observed amplifier output and input signal sequences for use by the DPD F/W 704 and can reside outside of the DPD Kernel 702. In another embodiment, the DPD Kernel 702 itself computes such updated/adapted parameters and the DPD F/W 704 performs primarily a supervisory role, and periodically polls and guides the DPD Kernel 702 as needed. For this case, the RAM may reside within the DPD Kernel 702 as indicated in FIG. 7. In an alternative embodiment, a digital signal processor (DSP) such as one from Texas Instruments' TMS320 DSP family or from Analog Devices' Blackfin/SHARC/TigerSHARC family may compute this process as digital signal processors evolve in speed, depending on the application requirements at hand.

Although not shown explicitly in FIG. 7, the upper transmit RF path of the RFIC 720 is typically connected to the power amplifier PA 212 (FIG. 2) and its drivers, while the lower receive RF path of the RFIC 720 generates appropriate complex baseband data for capture as the observation signal y. In one embodiment, a directional coupler is used to generate an RF sample for processing by the lower receive RF path. As described previously, in those applications in which in-band EVM is the primary concern, a sampling rate for digital-to-analog conversion can advantageously occur at least at the Nyquist rate of the bandlimited observation signal after processing by the observation path LPF/BPF (not shown in FIG. 7).

The implementation of the Predistortion with Integral Crest-Factor Reduction and Reduced Observation Bandwidth is an alternative to other combinations of existing linearization and crest-factor reduction techniques. The former category includes such techniques as Cartesian feedback, linear amplification using nonlinear components (LINC) and feedforward linearization, while the latter includes pulse shaping, subcarrier symbol insertion, and waveform phasing. Each technology has its advantages and disadvantages.

An embodiment of the invention having predistortion with integral crest-factor reduction and reduced observation bandwidth can advantageously be relatively less complex to implement as compared with other combined linearized and crest-factor reduced amplifier techniques. Furthermore, embodiments of the invention advantageously exhibit relatively low power and relatively high efficiency.

Embodiments of the invention can be implemented in hardware by, for example, a custom integrated circuit, by software, by, for example, firmware running on a general purpose digital signal processor or microprocessor, or by a combination of both hardware and software.

Embodiments of the invention can be useful in a variety of applications including micro and pico base station designs for WiMAX. These basestations are preferably relatively low distortion and relatively power efficient for OFDM signal amplification. Embodiments are also applicable to other commercial systems such as point-to-point, point-to-multipoint, and wireless local loop systems using similar or related modulation schemes. Embodiments are also applicable to cellular systems. Embodiments can also find relatively broad use in the satellite, cable broadcast and terrestrial broadcast industries, in which linear amplification with reduced crest-factor is desired. Embodiments can be applied to digital radio and television signals, which require amplification with relatively low distortion. Embodiments are applicable to transmitters, transmitter/receivers, and to transceivers.

The following description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment.

Various embodiments have been described above. Although described with reference to these specific embodiments, the descriptions are intended to be illustrative and are not intended to be limiting. Various modifications and applications may occur to those skilled in the art.

What is claimed is:

1. A method of determining predistortion coefficients for a digital predistorter for an RF power amplifier, the method comprising:

receiving an input signal to be predistorted in real time in full bandwidth by the digital predistorter;

crest factor reducing at least a portion of the input signal to generate a first modified input signal;

digitally predistorting the input signal to generate a second modified input signal to complement distortion of an RF power amplifier and to provide crest factor reduction via application of a predistortion function, wherein an analog signal based on the second modified input signal is intended to be provided as an input to the RF power amplifier, wherein digitally predistorting is performed by the digital predistorter, receiving an observed signal based on an output of the RF power amplifier; and adaptively adjusting predistortion coefficients of the digital predistorter based at least partly on at least one of:
(a) the input signal, the first modified input signal, and the observed signal or associated signal thereof; or
(b) the input signal and a signal based on a combination of the first modified signal and the observed signal or associated signal thereof.

2. The method of claim 1, wherein crest factor reducing is performed at a reduced data rate as compared to a data rate associated with digitally predistorting.

3. The method of claim 1, further comprising:
generating an adaptation error signal based at least partly on a combination of the first modified signal and the observed signal; and
adaptively adjusting predistortion coefficients of the digital predistorter based on the adaptation error signal.

4. The method of claim 1, further comprising:
preprocessing the observed signal with at least one of instantaneous, differential, and/or integrated amplitude or power; and
adaptively adjusting predistortion coefficients of the digital predistorter based at least partly on the preprocessed observed signal.

5. The method of claim 1, wherein the method is embodied in a transmitter of a transceiver or transmitter/receiver that uses time-division duplexing so that the observed signal is correspondingly time-division duplexed, the method further comprising preprocessing to hard and/or soft select only beginning segments and/or ending segments of a transmission represented by the observed signal.

6. The method of claim 1, further comprising RF sampling an output of the RF power amplifier to generate the observed signal.

7. The method of claim 1, further comprising:
low-pass filtering the observed signal to generate a low-pass filtered observed signal; and
adaptively adjusting predistortion coefficients based on the low-pass filtered observed signal.

8. The method of claim 1, further comprising:
band-pass filtering the observed signal to generate a band-pass filtered observed signal; and
adaptively adjusting predistortion coefficients based on the band-pass filtered observed signal.

9. The method of claim 1, further comprising:
filtering the observed signal to generate a filtered observed signal;
adaptively adjusting predistortion coefficients based on the filtered observed signal; and
adaptively adjusting a bandwidth of filtering and an attenuation characteristic of filtering to control relative amounts of out-of-band distortion versus in-band error vector magnitude (EVM) performance.

10. The method of claim 1, wherein an output of the RF power amplifier is RF coupled, downconverted, and converted to digital to generate the observed signal.

11. An apparatus comprising:
a crest factor reduction (CFR) processor configured to generate a first modified input signal from an input signal, wherein the first modified input signal is a crest factor reduced version of at least a portion of the input signal;
a digital predistorter having an input coupled to the input signal, wherein the digital predistorter is configured to generate a second modified input signal to complement distortion of an RF power amplifier and to provide crest factor reduction via application of a predistortion function, wherein an analog signal based on the second modified input signal is intended to be provided as an input to the RF power amplifier; and
an adaptive estimator configured to generate and adaptively adjust predistortion coefficients for the digital predistorter based at least partly on at least one of:
(a) the input signal, the first modified input signal, and an observed signal that is based on an output of the RF power amplifier; or
(b) a signal based on a combination of the input signal and the first modified signal and the observed signal.

12. The apparatus of claim 11, wherein the CFR processor operates at a reduced data rate as compared to a data rate associated with the digital predistorter.

13. The apparatus of claim 11, further comprising a differencing circuit configured to generate an adaptation error signal based at least partly on a combination of the first modified signal and the observed signal, and wherein the adaptive estimator is configured to generate and adaptively adjusting predistortion coefficients of the digital predistorter based on the adaptation error signal.

14. The apparatus of claim 11, further comprising a preprocessor configured to preprocess the observed signal to hard and/or soft select only a portion of the observed signal for adaption of the digital predistorter, wherein a selected portion is selected for at least one of instantaneous, differential, and/or integrated amplitude or power.

15. The apparatus of claim 11, wherein the apparatus comprises a time-division duplexed (TDD) transceiver so that the observed signal is correspondingly time-division duplexed, the apparatus further comprising a preprocessor configured to preprocess the observed signal to hard and/or soft select only beginning segments and/or ending segments of a transmission represented by the observed signal.

16. The apparatus of claim 11, further comprising a preprocessor configured to preprocess the observed signal to select only a portion of the observed signal for adaption of the digital predistorter, wherein a selected portion corresponds to at least one of instantaneous, differential, and/or integrated amplitude 17. The apparatus of claim 11, further comprising a directional coupler coupled to an output of the RF power amplifier, wherein the directional coupler is configured to generate the observed signal.

18. The apparatus of claim 11, further comprising a low-pass filter configured to filter the observed signal to generate a low-pass filtered observed signal, and wherein the adaptive estimator is configured to adaptively adjust predistortion coefficients based on the low-pass filtered observed signal.

19. The apparatus of claim 11, further comprising a band-pass filter configured to filter the observed signal to generate a band-pass filtered observed signal, and wherein the adaptive estimator is configured to adaptively adjust predistortion coefficients based on the band-pass filtered observed signal.

20. The apparatus of claim 11, further comprising a filter configured to filter the observed signal to generate a filtered observed signal, wherein:
the adaptive estimator is configured to adaptively adjust predistortion coefficients based on the filtered observed signal; and
the adaptive estimator is configured to adaptively adjust a bandwidth of filtering and an attenuation characteristic of filtering to control relative amounts of out-of-band distortion versus in-band error vector magnitude (EVM) performance.

21. An apparatus for determining predistortion coefficients for a digital predistorter for an RF power amplifier, the apparatus comprising:
means for receiving an input signal to be predistorted in real time in full bandwidth by the digital predistorter;
means for reducing a crest factor of the input signal to generate a first modified input signal;

a digital predistorter configured to digitally predistort the input signal to generate a second modified input signal to complement distortion of an RF power amplifier and to provide crest factor reduction via application of a predistortion function, wherein an analog signal based on the second modified input signal is intended to be provided as an input to the RF power amplifier; and means for adaptively adjusting predistortion coefficients of the digital predistorter based at least partly on at least one of:
 (a) the input signal, the first modified input signal, and the observed signal that is based on an output of the RF power amplifier; or
 (b) the input signal and a signal based on a combination of the first modified signal and the observed signal.

22. The apparatus of claim 21, wherein the crest factor reducing means operates at a reduced data rate as compared to a data rate associated with the digital predistorter.

23. The apparatus of claim 21, further comprising a means for generating an adaptation error signal based at least partly on a combination of the first modified signal and the observed signal, wherein the adaptively adjusting predistortion coefficients means is configured to adaptively adjust the digital predistorter based on the adaptation error signal.

24. The apparatus of claim 21, further comprising preprocessing means for preprocessing the observed signal with at least one of instantaneous, differential, and/or integrated amplitude or power, wherein the adaptively adjusting means is configured to adaptively adjust based at least partly on the preprocessed observed signal.

25. The apparatus of claim 21, wherein the apparatus comprises a time-division duplexed (TDD) transceiver so that the observed signal is correspondingly time-division duplexed, the apparatus further comprising a preprocessor configured to preprocess the observed signal to hard and/or soft select only beginning segments and/or ending segments of a transmission represented by the observed signal.

26. The apparatus of claim 21, further comprising a filter configured to filter the observed signal to generate a filtered observed signal, wherein the adaptively adjusting predistortion coefficients means adjusts predistortion coefficients based on the filtered observed signal, and wherein the adaptively adjusting predistortion coefficients means adaptively adjusts a bandwidth of the filter and an attenuation characteristic of the filter to control relative amounts of out-of-band distortion versus in-band error vector magnitude (EVM) performance.

* * * * *